United States Patent [19]
Takahashi

[11] Patent Number: 5,912,066
[45] Date of Patent: Jun. 15, 1999

[54] SILICON NITRIDE CIRCUIT BOARD AND PRODUCING METHOD THEREFOR

[75] Inventor: Takashi Takahashi, Tokyo, Japan

[73] Assignee: Kabushiki Kaisha Toshiba, Japan

[21] Appl. No.: 08/808,417

[22] Filed: Feb. 28, 1997

[30] Foreign Application Priority Data

Mar. 27, 1996 [JP] Japan .................................. 8-072250
Sep. 4, 1996 [JP] Japan .................................. 8-234045

[51] Int. Cl.⁶ ............................................. B32B 3/00
[52] U.S. Cl. ..................... 428/195; 428/209; 428/210; 428/457; 428/688; 428/698; 428/702; 428/901
[58] Field of Search .................................. 428/195, 209, 428/210, 457, 641, 650, 671, 674, 688, 698, 702, 901

[56] References Cited

U.S. PATENT DOCUMENTS

| | | |
|---|---|---|
| 4,591,535 | 5/1986 | Mizuhara . |
| 4,613,549 | 9/1986 | Tanaka . |
| 4,685,607 | 8/1987 | Takeda et al. . |
| 4,693,409 | 9/1987 | Mizunoya et al. . |
| 4,977,012 | 12/1990 | Ishikawa ................................ 428/209 |
| 5,176,309 | 1/1993 | Horiguchi et al. . |
| 5,686,172 | 11/1997 | Ohya et al. ............................. 428/210 |

FOREIGN PATENT DOCUMENTS

6-216481  8/1994  Japan .

OTHER PUBLICATIONS

English Abstract of Japan Publication No. 62289396, *Patent Abstracts of Japan*, vol. 012, No. 179 (M–701), May 1988.
English Abstract of Japan Publication No. 09153567, *Patent Abstracts of Japan*, vol. 097, No. 010, Oct. 1997.
English Abstract of Japan Publication No.09064235, *Patent Abstracts of Japan*, vol. 097, No. 007, Jul. 1997.
English Abstract of Japan Publication No. 08319187, *Patent Abstracts of Japan*, vol. 097, No. 004, Apr. 1997.

*Primary Examiner*—Elizabeth Evans
*Attorney, Agent, or Firm*—Finnegan, Henderson, Farabow, Garrett & Dunner, L.L.P.

[57] ABSTRACT

A silicon nitride circuit board comprises a silicon nitride substrate having oxide layers at surfaces thereof, and copper system circuit plates directly bonded to the silicon nitride substrate thorough the oxide layer by the use of the DBC (copper directly bonding) method. The oxide layer disposed on the surface of the silicon nitride substrate consists essentially of an aluminum oxide layer. This aluminum oxide layer is formed by the process of coating/calcinating a super fine grain alumina sol. The aluminum oxide layer is dense and stable compared with an Si—O system oxide layer which is formed on the silicon nitride substrate by the use of the thermal oxidization method. In particular, the aluminum oxide layer formed by the process of coating/calcinating the super fine grain alumina sol is superior in interface bonding ability with the silicon nitride substrate. Therefore, when the copper system circuit plate is bonded to the silicon nitride substrate by the use of the DBC method, the poor bonding and the blistering can be controlled to be generated, and then the thermal resistance due to the oxide layer can be controlled to be increased.

12 Claims, 2 Drawing Sheets

SILICON NITRIDE CIRCUIT BOARD AND PRODUCING METHOD THEREFOR

BACKGROUND OF THE INVENTION

1. Field of the Invention

The present invention relates to a silicon nitride circuit board in which a copper system (a copper and a copper alloy) circuit plate is bonded to a silicon nitride substrate by the use of the copper directly bonding method, and a manufacturing method therefor.

2. Description of the Related Art

Conventionally, there have been used various kinds of substrates such as a ceramics substrate, a resin substrate, and etc., as a substrate for mounting electronic components such as semiconductor devices, etc. Especially, many ceramic substrates have been used for the circuit board for mounting the electronic components having high radiation efficiency, since the ceramic substrate has satisfactory electrical insulation and heat radiation efficiency, and etc.

Also conventionally, the above-mentioned ceramic substrate has been mainly made of a sintered alumina. However, the alumina substrate has its limit with respect to the heat dissipation efficiency. This is because that the heat generated in the semiconductor device tends to increase year by year with the increases of the integration, the frequency and the output power of the semiconductor device realized in recent years. Therefore, there is put to practical use the ceramic substrate made of an aluminum nitride (AlN) which has about ten times the thermal conductivity of alumina and is approximate to silicon (Si) in coefficient of thermal expansion.

Since the aluminum nitride substrate has the above-mentioned characteristic, but has not high mechanical strength and toughness, it has disadvantages that features are generated due to the clamping executed at the assembling step, and that cracks are apt to be generated when the thermal cycles are applied thereto. Therefore, the aluminum nitride substrate is inferior in mechanical reliability among the ceramic substrates for mounting the electronic components, which depends on the element characteristic.

There is noticed the ceramic substrate made of a silicon nitride ($Si_3N_4$) which is inferior in thermal conductivity compared with the aluminum nitride substrate, but is approximate in thermal expansion to silicon (Si) then is superior in mechanical strength and toughness. The silicon nitride substrate has been capable of obtaining the thermal conductivity not less than, for example, 40 W/m K, by controlling the particle size of the silicon nitride raw material, the composition of the sintering auxiliary composition, and etc.

In a case where the above-mentioned silicon nitride substrate is used as the circuit board, etc., it is indispensable to bond a metal circuit plate to a surface of the substrate similarly to the ordinary ceramic substrates. It is studied that, when the circuit plate is bonded to the silicon nitride substrate, a copper system circuit plate is employed as the circuit plate, and then this copper system circuit plate is bonded to the silicon nitride substrate by the use of the copper directly bonding method (hereinafter referred to as "the DBC method") or the metal activating method.

In a case where the copper system plate is bonded to the silicon nitride substrate by the use of the DBC method, an oxide layer is required to be formed on a surface of the silicon nitride substrate because a copper-oxygen system eutectic compound is used for the DBC method. The oxide layer is formed on the surface of the ceramic substrate usually by the use of the thermal oxidization method. However, there is a problem that the stable oxide layer which is required for the DBC method is hard to be formed on the silicon nitride by the use of the thermal oxidization method. This is because that the silicon nitride has complicated fine structure and that an Si—O system oxide ($SO_2$, etc.) formed by the thermal oxidization method can be of various kinds of crystal structures.

That is, the oxide layer having a thickness of about 1 to 3 $\mu$m is necessary for the purpose of the bonding of the copper system circuit board due to the DBC method. When the oxide layer having such a thickness is formed on the surface of the silicon nitride substrate by the use of the thermal oxidization method, fine cracks and pores of large diameter are inevitably generated. The liquid phase of the copper-oxygen system eutectic compound (Cu—$Cu_2O$ eutectic compound, etc.) generated at a high temperature is utilized for the bonding by the DBC method, the liquefied eutectic compound penetrates through the oxide layer to the silicon nitride substrate if the cracks and pores exist in the oxide layer. The liquefied eutectic compound which has reached the silicon nitride substrate acts upon the silicon nitride to generate nitrogen gas, which gas causes a generation of the blister and results in a poor bonding strength between the silicon nitride substrate and the copper system circuit plate.

Further, Si—O system oxide such as $SiO_2$, etc., has a disadvantage that the thermal conductivity thereof is very low. In a case where the copper system circuit plate is bonded to the silicon nitride substrate through the Si—O system oxide layer which is low in thermal conductivity, the Si—O system oxide layer causes to prevent the thermal transmission (radiation) from the semiconductor components, etc., to the silicon nitride substrate. Therefore, the thermal conductivity which is essentially possessed by the silicon nitride substrate cannot be utilized.

From the above, in the silicon nitride substrate applied by the DBC method, there are requested to be capable of easily forming the oxide layer which is stable and has a sufficient thickness, and then is indispensable when applying the DBC method to the silicon nitride substrate, and to depress the increasing of the thermal resistance due to the oxide layer.

SUMMARY OF THE INVENTION

It is therefore an object of the present invention to provide an oxide layer which is stable and has a sufficient thickness, and then is indispensable when applying the DBC method to the silicon nitride substrate, and to provide a silicon nitride circuit board and a producing method therefor, which is capable of controlling the poor bonding, the blistering, etc., by utilizing such an oxide layer. Further, it is another object to provide a silicon nitride circuit board which is capable of depressing the increasing of the thermal resistance due to the oxide layer.

A silicon nitride circuit board according to the present invention is characterized by comprising a silicon nitride substrate, an oxide layer consisting essentially of aluminum oxide, disposed on a surface of the silicon nitride substrate, and a copper system circuit plate directly bonded to the silicon nitride substrate through the oxide layer. In the silicon nitride circuit board according to the present invention, the oxide layer may include in a range of 10 to 1000 ppm by weight at least one element selected from a group of Sn, Si, Ti, Y and Er.

A method of producing a silicon nitride circuit board, according to the present invention, characterized by comprising the steps of coating a super fine grain alumina sol on a surface of a silicon nitride substrate, then forming an aluminum oxide layer by heat treatment in an air atmosphere, bringing a copper system circuit plate into contact with the silicon nitride substrate through the aluminum oxide layer, and bonding the copper system circuit plate to the silicon nitride substrate by heat treatment. In the method of manufacturing a silicon nitride circuit plate board, according to the present invention, the super fine grain alumina sol may include in a range of 10 to 1000 ppm at least one element selected from a group of Sn, Si, Ti, Y and Er.

In the silicon nitride circuit board according to the present invention, there is used as a surface oxide layer, the aluminum oxide layer having a thermal conductivity which is greater than the Si—O system oxide such as $SiO_2$, etc., obtained when the ordinary thermal oxidization method is applied to the silicon nitride substrate. Accordingly, there can be controlled to be decreased the radiation efficiency of the silicon nitride circuit board due to the oxide layer.

Also, as the aluminum oxide layer is used as the oxide layer, for example, when the DBC method is applied to the aluminum nitride substrate, the dense layer have little pores and cracks, etc., can be easily obtained therefrom. The aluminum oxide layer can be stably formed by various kinds of forming methods to the silicon nitride substrate also. Accordingly, the poor bonding, the blistering, and etc., can be controlled to be generated, due to the micro defects such as the pores, the cracks and etc., in the oxide layer.

Further, at least one element selected from a group of Sn, Si, Ti, Y and Er are contained in a range of 10 to 1000 ppm in the aluminum oxide layer, which results in further improvement of the interface bonding ability between the silicon nitride substrate and the aluminum oxide layer.

The alumina sol of the super fine grain used in the producing method of the present invention is obtained by directly dispersing the alumina of super fine grain in the water. The alumina of super fine grain can be dispersed in the water relatively in large quantities. By using such a super fine grain alumina sols, the aluminum oxide layer can be obtained, having a film thickness which is necessary for the DBC method by, for example, one time of the coating/calcinating process, which results in the decrease of the man-hour and the cost which are required for forming the aluminum oxide layer.

In addition, the super fine grain alumina sol is highly active, thereby facilitating the formation of the reaction layer with the silicon nitride substrate. The reaction layer brings about an improvement of the bonding strength between the silicon nitride substrate and the aluminum oxide layer. Further, by using the super fine grain alumina sol including in a range of 10 to 1000 ppm at least one element selected from a group of Sn, Si, Ti, Y and Er, the interface bonding strength between the silicon nitride substrate and the aluminum oxide layer can be further improved.

Also, since the obtained aluminum oxide layer is the sintered layer of the granulated alumina of super fine grain, the aluminum oxide layer becomes a dense film and has extremely smoothed surfaces. Accordingly, in the DBC process, the liquid phase of the Cu—O system eutectic compound satisfactorily wet, thereby raising the bonding strength of the silicon nitride substrate and the copper system circuit plates. Further, the dense aluminum oxide layer brings about the prevention of the poor bonding, the blistering, etc., and the decrease of the thermal resistance.

DETAILED DESCRIPTION OF THE PREFERRED EMBODIMENTS

The invention will now be described in detail with reference to the drawings showing an embodiment thereof.

Figure 1:
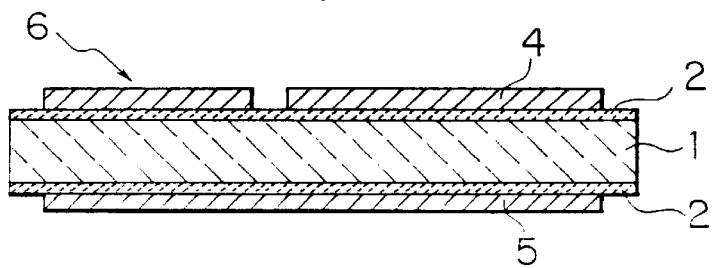
FIG. 1 is a sectional view showing a construction of a silicon nitride circuit board according to one embodiment of the present invention.

FIG. 1 is a sectional view of a silicon nitride circuit board according to one embodiment of the invention. In the drawing, reference numeral 1 designates a silicon nitride substrate, which is preferably made of the one having the thermal conductivity in particular not less than 50 W/m K.

The silicon nitride ($Si_3N_4$) sintered body constituting the silicon nitride substrate 1 is well known as a ceramic having high strength and high toughness. Further, for example, by making the silicon nitride powder, as the raw material of the sintered body, fine grain and high purity by controlling the composition of the sintering auxiliary, and so on, the silicon nitride (silicon nitride substrate 1) having relatively high thermal conductivity of, for example, not less than 50 W/m K, can be obtained without prejudicing mechanical characteristic such as high strength and high toughness which are essential. In this invention, it is preferable to utilize the silicon nitride substrate 1 which is superior in thermal conductivity.

The aluminum oxide layers 2, 2 are formed as the oxide layer on surfaces of the silicon nitride substrate 1, respectively. The thickness of the aluminum oxide layer 2 is preferably of a range of from 1 to 5 $\mu$m. If the thickness of the aluminum oxide layer 2 is less than 1 $\mu$m, there is a fear that the bonding becomes unstable when the copper system circuit plates 4, 5, described hereinafter, are bonded thereto by the use of a copper directly bonding method (DBC method), whereas, if greater than 5 $\mu$m, there is a fear that the aluminum oxide layer 2 itself is apt to be exfoliated, and so on.

The aluminum oxide layer 2 has a smooth surface and has little pores, cracks, and etc., can be easily obtained, can be made stable on the silicon nitride substrate 1 by applying various kinds of film forming methods thereto. Although the aluminum oxide layer 2 can be formed by the membrane method such as the sputtering method, or the film forming method such as the sol-gel method, etc., which uses aluminum alkycide, etc., it is preferable that the aluminum oxide layer 2 is formed by, in particular, a coating/calcination of a super fine grain alumina sol, described in detail hereinafter.

There can be easily obtained the aluminum oxide layer 2, which is dense, by the coating/calcination of the super fine grain alumina sol. For example, the pores exist in the aluminum oxide layer 2 can be made minute to not greater than 100 nm in diameter, and then there can be obtained the aluminum oxide layer 2 made of high purity $\alpha$-$Al_2O_3$, which results in an improvement of the thermal conductivity of the aluminum oxide layer 2. Further, the fineness of the pores in the aluminum oxide layer 2 brings about an improvement of the bonding strength between the silicon nitride substrate 1 and the copper system circuit plates 4, 5.

Figure 2:
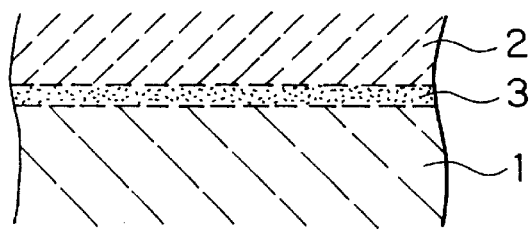
FIG. 2 is a schematically enlarged sectional view showing a bonded interface between the silicon nitride substrate and the aluminum oxide layer of the silicon nitride circuit board shown in FIG. 1.

A super fine grain alumina sol is obtained, for example, by dispersing directly granulated alumina of super fine grain having a grain size of 2 to 20 nm into a water. Such granulated alumina of super fine grain is sufficiently highly active. As shown in an enlarged view of FIG. 2, at an interface between the silicon nitride substrate 1 and the aluminum oxide layer 2 can be relatively easily formed a reaction layer 3 thereof, by utilizing the above-mentioned granulated alumina of super fine grain as a starting material of the aluminum oxide layer 2.

The above-mentioned reaction layer 3 is formed by dispersion/solution-treating Al and O of constituent elements of the aluminum oxide layer 2 in the vicinity of a surface of the silicon nitride substrate 1. Such a reaction layer 3 brings about an improvement of the bonding strength of the aluminum oxide layer 2 to the silicon nitride substrate 1. In other words, the reaction layer 3 is formed between the interface between the silicon nitride substrate 1 and the aluminum oxide layer 2 to thereby increase the bonding strength therebetween. The reliability of a silicon nitride circuit board 6 is improved with the improvement of the bonding strength between the silicon nitride substrate 1 and the aluminum oxide layer 2.

The aluminum oxide layer 2 may include in a range of 10 to 1000 ppm at least one element selected from a group of Sn, Si, Ti, Y and Er. These elements aim to raise the interface bonding ability between the silicon nitride substrate 1 and the aluminum oxide layer 2. The above-mentioned elements each brings about an improvement of the interface bonding ability between the aluminum oxide layer 2 and the copper system circuit plates 4, 5, described hereinafter. However, since the micro defects such as the pores, the cracks, and etc., are apt to be generated if the above-mentioned elements are contained too much, the contents thereof is to be not greater than 1000 ppm. If the contents of the above-mentioned element is less than 10 ppm, there cannot be obtained the effect of improving the interface bonding ability, accordingly, it is preferable that the contents thereof is greater than 10 ppm.

The above-mentioned at least one element selected from a group of Sn, Si, Ti, Y and Er is previously added to the material for forming the aluminum oxide layer 2, for example, a super fine grain alumina sol to thereby be contained in the aluminum oxide layer 2. On this occasion, the oxide of the above additional element, the compound changing to the oxide due to the heating, and etc., may be added thereto. These additional elements are dispersed from the aluminum oxide layer 2 to the silicon nitride substrate 1 to thereby be contained in the above reaction layer 3 also. In addition to the above Si, N, Al and O, the reaction layer 3 including the above additional elements improves much more the bonding ability between the silicon nitride substrate 1 and the aluminum oxide layer 2.

Si as the main constituent element of the silicon nitride substrate 1, and Ti, Y, Er which are optionally mixed to the silicon nitride substrate 1 as the sintering auxiliary composition, and etc., among the above-mentioned respective elements can be contained into the aluminum oxide layer 2 from the silicon nitride substrate 1 by the dispersion. The elements dispersed from the silicon nitride substrate 1 to the aluminum oxide layer 2 also brings about an improvement of the formation of the reaction layer 3 at the interface between the silicon nitride substrate 1 and the aluminum oxide layer 2, and further an improvement of the bonding strength therebetween.

The copper system circuit plates 4, 5 are directly bonded to the silicon nitride substrate 1 having the aluminum oxide layer 2 as the oxide layer of the surface, through the aluminum oxide layer 2 by the DBC method. The silicon nitride circuit board 6 according to the invention is constituted as described above. A copper plate or a copper alloy plate can be used for the copper system circuit plates 4, 5 similarly to the ordinary substrate applied by the DBC method. Further, a copper clad plate, etc., in which the other metal plate is cladded by the copper plate can be used therefor.

The one patterned into a desired circuit shape by the etching or the press-work, etc., can be bonded to the copper system circuit plates 4, 5. Also, a single plate such as copper, copper alloy, and etc., is bonded thereto, then they may be patterned in the circuit shape by the etching, etc. The thickness each of the copper system circuit plates 4, 5 is preferably not greater than 0.5 mm. If the thickness of each of the copper system circuit plates 4, 5 is greater than 0.5 mm, the thermal stress generated at the cooling process after the heating/bonding, etc., is increased, there is a fear that the poor bonding is caused.

In the above-mentioned silicon nitride circuit board 6, the copper system circuit plates 4, 5 are bonded the silicon nitride substrate 1 by the use of the DBC method trough the aluminum oxide layer 2 which is dense, then is superior in smoothness of surface, and greater in coefficient of thermal conductivity compared with the silicon nitride, which results in the prevention of a Cu—O system eutectic compound from penetrating through the oxide layer (aluminum oxide layer 2) then reaching the silicon nitride substrate 1, thereby preventing the gas from generating. Therefore, the silicon nitride substrate 1 and the copper system circuit plates 4, 5 can be bonded to each other stably with bonding strength, which results in prevention of generating the poor bonding and the blistering.

Further, if the aluminum oxide layer 2 may include in a range of 10 to 1000 ppm at least one element selected from a group of Sn, Si, Ti, Y and Er, the interface bonding ability can be improved, which can more stably prevent the poor bonding and the blistering from generating. Then, the bonding strength between the silicon nitride substrate 1 and the copper system circuit plates 4, 5 can be much more increased.

Figure 3:
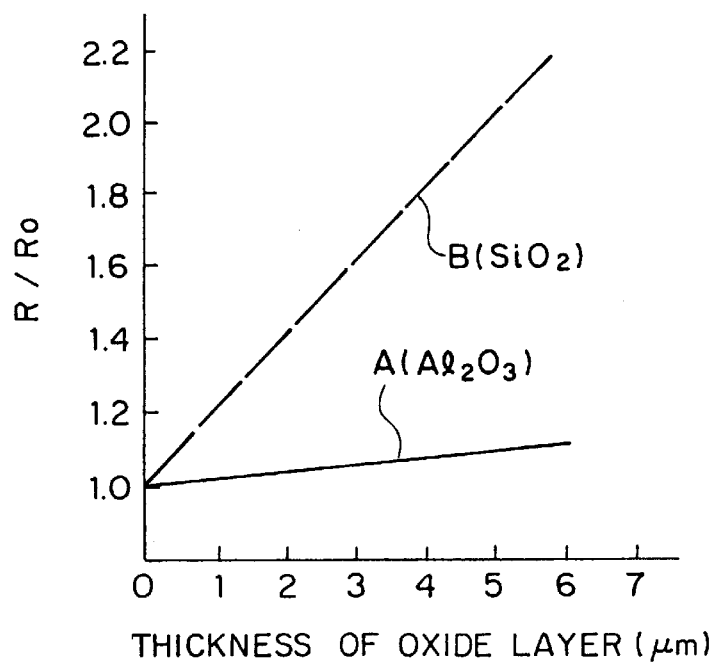
FIG. 3 is a view showing a relationship between a thickness of the oxide layer disposed on the surface of the silicon nitride substrate and the thermal resistance ratio R/R0 of the silicon nitride substrate having the oxide layer.

The aluminum oxide layer 2 has a thermal conductivity of 20 W/m K which is rather satisfactory as the oxide, compared with silicon oxide having a thermal conductivity of about 2 W/m K, thereby controlling the increase of the thermal resistance caused by the oxide layer. FIG. 3 is a view showing a relationship of a thickness of the oxide layer disposed on the surface of the silicon nitride substrate 1 and a thermal resistance ratio $R/R_0$ of the silicon nitride substrate 1 having the oxide (R designates a thermal resistance per unit area caused when the surface oxide layers each having a thickness of x $\mu$m are formed on the both surfaces of the silicon nitride substrate 1, and $R_0$ a thermal resistance per unit area caused when not the surface oxide layer, and the thermal conductivity of silicon nitride is 100 W/m K)

In FIG. 3, the solid line A represents the results obtained when the aluminum oxide layer (thermal conductivity=20 W/m K) 2 is applied as the oxide. The broken line B represents the results obtained when the silicon oxide layer (thermal conductivity=about 2 W/m K) is used as the oxide, for comparison with the invention. As apparent from FIG. 3, in a case where the silicon oxide layer is used as the oxide layer, the thermal resistance is increased remarkably when the oxide layer having a film thickness required for the DBC method is formed, whereas in a case where the aluminum oxide layer 2 is used as the oxide layer, the thermal resistance can be controlled to be increased even when the oxide layer having a film thickness required for the DBC method is formed, thereby controlling the decrease of the radiation due to the oxide. Also, as mentioned above, when the aluminum oxide layer 2 is used, there can be prevented the poor bonding and the blistering from generating, thereby obtaining the silicon nitride circuit board 6 which is superior in thermal conductivity.

The silicon nitride circuit board 6 according to this embodiment has a satisfactory bonding condition and a superior bonding strength between the silicon nitride substrate 1 and the copper system circuit plates 4, 5, and is less in thermal resistance and superior in heat transport, thereby mounting semiconductor devices, etc., which dissipates a large amount of heat, and increasing remarkably the reliability of the circuit board itself.

The silicon nitride circuit board 6 according to this embodiment can be produced, for example, as described hereinbelow. Producing processes of the silicon nitride circuit board 6 according to the invention will be described hereinbelow with reference to FIG. 4A to FIG. 4C.

First, the silicon nitride substrate 1 is produced. When the silicon nitride substrate 1 is produced, first a sintering auxiliaries such as rare earth oxide powder, hafnium oxide powder, alumina powder, and etc., are added and mixed to the silicon nitride powder, whereby the material powder of a silicon nitride sinter is prepared. Preferably, the fine powder having the average grain size of not greater than 5 $\mu$m is used for the silicon nitride powder as the starting material. The silicon nitride sintered body, which is superior in mechanical characteristic and high in thermal conductivity, that is, the silicon nitride substrate 1 can be obtained by using the above silicon nitride powder of fine grain. More preferably, the average grain size of the silicon nitride powder is not greater than 1 $\mu$m, then much more preferably, not greater than 0.5 $\mu$m.

The rare earth element added as the sintering auxiliaries are the oxides such as Y, La, Sc, Pr, Ce, Nd, Dy, Gd, Er and etc., or the material which is oxidized to the above oxide during the sintering operation. Also, the oxide of Hf can be used. These materials are contained in the sintering auxiliary individually, or as a combination of two kinds or more. In particular, yttrium oxide ($Y_2O_3$) is preferably used. These sintering auxiliary act upon the silicon nitride material powder to generate a liquid phase, thereby functioning as a sintering accelerator.

An addition amount of the above sintering auxiliary preferably set to a range of 2 to 7.5% by weight of the silicon nitride powder with the calculation in terms of oxide. If this addition amount is less than 2% by weight, it is difficult to get the dense silicon nitride sintered body and result in a low mechanical strength and a low thermal conductivity, whereas if the addition amount is greater than 7.5% by weight, the boundary phase in the sintered body is generated too much, whereby the thermal conductivity and the strength thereof are started to decrease. Particularly, the addition amount preferably falls within a range of from 3 to 6% by weight.

Further, alumina ($Al_2O_3$) as another addition composition serves to promote the function as the sintering accelerator for the above rare earth elements. If the addition amount of alumina as a source of aluminum is less than 0.5% by weight, the density of the sintered body becomes insufficient, whereas if greater than 2% by weight, the boundary phase is generated too much, or the solution to the silicon nitride is caused, thereby decreasing the thermal conductivity. Therefore, the addition amount of alumina is preferably set within a range of from 0.5 to 2% by weight. In particular, the addition amount is preferably within a range of from 0.7 to 1.5% by weight.

Further, tantalum oxide, niobium oxide, titanium oxide, tungsten oxide, and etc., may be added to the material powder of the silicon nitride for the purpose of preventing carbon from remaining after the degreasing. However, since Li, Na, K, Fe, Ca, Mg, Sr, Ba, Mn, B, and etc., as the other impurity positive ion element become the substance for impeding the thermal conductivity, the addition amount of the above impurity positive ion element is set to not greater than 0.3% by weight in order to make the thermal conductivity greater than 50 W/m K.

An organic binder, an organic solvent, and etc., are added then mixed to the material powder of the silicon nitride, whereby the powder is made slurry. This slurry is formed in a sheet manner by the use of the ordinary molding method such as the doctor blade method, etc., to thereby produce the silicon nitride green sheet. This silicon nitride green sheet is degreased in an air, or in an non-oxidizing atmosphere such as a nitrogen atmosphere, and then calcinated in the non-oxidizing atmosphere such as the nitrogen atmosphere, to thereby obtain the silicon nitride substrate 1.

Next, a super fine grain alumina sol which is a source for forming the aluminum oxide layer 2 is prepared. On this occasion, the colloid liquid in which the granulated alumina of super fine grain having a grain size of, for example, about 2 to 20 nm is dispersed in a water (dispersant) with a range of 5 to 20% by weight is used as the super fine grain alumina sol. Such a granulated alumina of super fine grain can be dispersed directly in the water in the form of the alumina grain. Further, as described above, a large quantity of alumina grain of 5 to 20% by weight can be dispersed in the water as the dispersant.

It is possible to add at least one element selected from a group of Sn, Si, Ti, Y and Er in a range of 10 to 1000 ppm to a super grain of alumina sol, on occasion demands. The above-mentioned elements may be added in the form of not only a single element powder and an alloy powder of the elements but also the oxide of each of the elements, the compound changeable to the oxide by the heating, and etc.

Figure 4A:
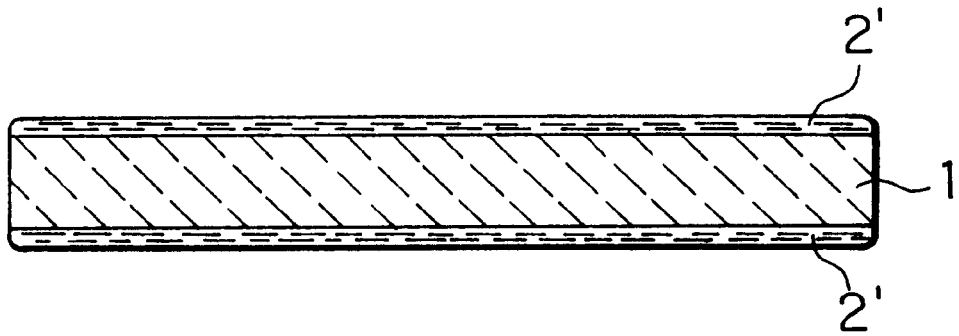
FIG. 4A to FIG. 4C are sectional views showing one example of a process of producing the silicon nitride circuit board shown in FIG. 1.

As shown in FIG. 4A, the above super fine grain alumina sol is coated on surfaces of the silicon nitride substrate 1, then coated films 2' of alumina sol is formed on the surfaces of the silicon nitride substrate 1. The alumina sol is coated by ordinary methods such as the spin coating method, the dip coating method, the spray coating method, and etc. The thickness of the coated film is set according to the film thickness of the aluminum oxide layer 2 formed after the calcination.

Figure 4B:
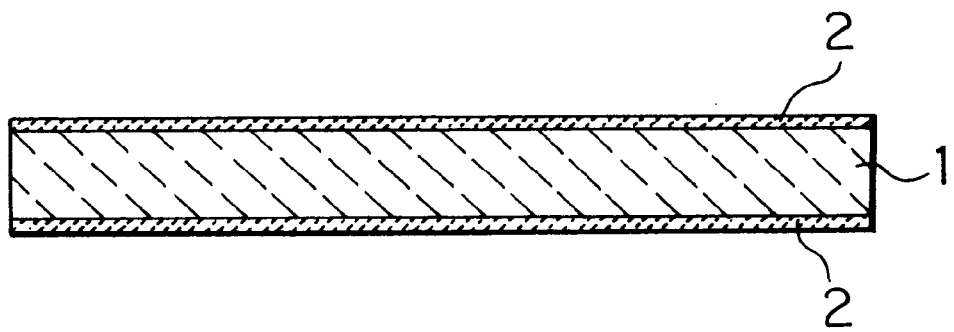

Next, the silicon nitride substrate 1 on which the coated film 2' of alumina sol is heat-treated (calcinated) in an air atmosphere at a temperature of, for example, from 1173 to 1573 K. Due to this heat treatment in the atmosphere, the super fine grain of alumina in the alumina sol is calcinated to thereby obtain the aluminum oxide layer 2, as shown in FIG. 4B. On this occasion, if there is used a super fine grain alumina sol including at least one element selected from a group of Sn, Si, Ti, Y and Er, there can be obtained the aluminum oxide layer 2 including these elements with a range of 10 to 1000 ppm. Thus, the aluminum oxide layers 2, 2 are formed on the surfaces of the silicon nitride substrate 1.

Incidentally, the super fine grain alumina sol used for forming the aluminum oxide layers 2, 2 is dispersed relatively in large quantities in the water directly in the form of alumina grain as described above. Accordingly, for example, by adjusting the coating condition, there can be obtained the aluminum oxide layer 2 having the film thickness required for the DBC method, in concrete, the film thickness of 1 to 5 μm by one time of the coating/calcinating process.

For example, in a case where an ordinal sol-gel method which uses metal alkoxides as raw material sol is used, a few times of the coating/calcinating processes must be executed repeatedly in order to obtain the aluminum oxide layer 2 having the similar film thickness, which cannot prevent the increases of the producing man-hour and the producing cost. Then, in a case of the sputtering method, the increase of the producing cost cannot be evitable. The reaction layer 3 cannot be formed satisfactorily between the silicon nitride substrate 1 and the aluminum oxide layer 2 by the sputtering method, which results in a small bonding strength of the aluminum oxide layer 2.

On the contrary, according to the above-mentioned forming process, there can be obtained the aluminum oxide layer 2 having the necessary film thickness by a simple and inexpensive process such as the coating/calcinating of the super fine grain alumina sol, and at one time of the coating/calcinating process, which results in the decreases of the man-hour and the cost of forming the aluminum oxide layer 2. Further, the reaction layer 3 can be formed relatively easily. The reaction layer 3 serves to raise the bonding strength between the silicon nitride substrate 1 and the aluminum oxide layer 2. In addition, at least one element selected from a group of Sn, Si, Ti, Y and Er also can be easily contained in the aluminum oxide layer 2.

Also, the obtained aluminum oxide layer 2 is the sintered layer of the granulated alumina of super fine grain, which realizes a minute film and extremely smoothed surfaces. Accordingly, in the DBC process executed later, a Cu—O system eutectic compound formed at the heat-treating process is prevented from penetrating through the oxide (aluminum oxide layer 2) then reaching the silicon nitride substrate 1. Further, the liquid phase of the Cu—O system eutectic compound satisfactorily wet, thereby raising the bonding strength of the silicon nitride substrate 1 and the copper system circuit plates 4, 5.

Figure 4C:
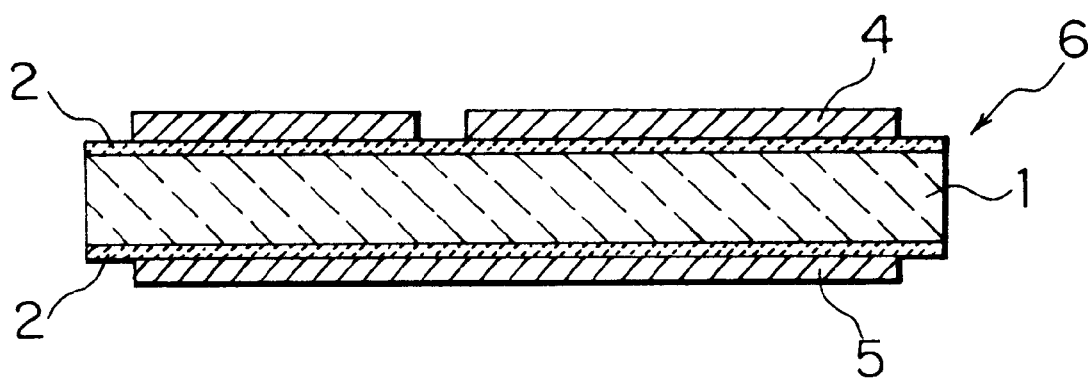

After that, as shown in FIG. 4C, according to the ordinary DBC method, the copper system circuit plates 4, 5 are bonded to the silicon nitride substrate 1 through the aluminum oxide layers 2, 2, to thereby obtain the final silicon nitride circuit substrate 6.

In concrete, the copper system circuit plates 4, 5 are first arranged so as to bring in contact with the aluminum oxide layers 2, 2 on the surface of the silicon nitride substrate 1, which is next subjected to the heat treatment in an inert gas atmosphere such as a nitrogen atmosphere in which the oxygen partial pressure is controlled, at a temperature from the melting point (1338 K) of a copper-oxygen system eutectic compound to the melting point of copper (1356 K). By this heat treatment, the surfaces of the silicon nitride substrate 1 is made wet by the liquid phase of the copper-oxygen system eutectic compound, then this liquid phase is cooled/solidified, thereby bonding the silicon nitride substrate 1 and the copper system circuit plates 4, 5.

As a result of executing the above-mentioned processes, there can be obtained with a satisfactory reproducibility and at a low cost, the silicon nitride circuit substrate 6 having a small thermal resistance and a high bonding strength, which prevents the poor bonding and the blistering.

Next, experimental examples of the above-mentioned embodiment and the evaluated results will be described hereinbelow.

EXPERIMENTAL EXAMPLE 1

The silicon nitride substrate 1 having a thermal conductivity of 70 W/m K and a thickness of 0.5 mm was first prepared. On the silicon nitride substrate 1 was coated by a spin coater, a super fine grain alumina sol (water dispersing body/alumina sol-10 (trade name), made by Kawaken Fine Chemical Kabushiki Kaisha) including a granulated alumina of super fine grain having a grain size of 2 to 20 nm by 10% by weight. The coating condition was set such that the film thickness of the aluminum oxide formed after the calcinating was 2 μm.

Next, the silicon nitride substrate 1 on which the coated film of super fine grain alumina sol was formed was heat-treated in an air atmosphere. The heat treatment temperature was set to 1473 K which was greater than the bonding temperature due to the DBC method. At the heat treating process in the above atmosphere, the aluminum oxide layers 2, 2 each having a thickness of about 2 μm was formed on the surfaces of the silicon nitride substrate 1. The aluminum oxide layer 2 having such a film thickness was obtained by one time of the coating/calcinating process of alumna sol of super fine grain.

The micro structure of the obtained aluminum oxide layer 2 was observed by a scanning electron microscope (SEM). As a result, it had a dense micro structure having little cracks, and had no coarse pores, whereas then merely there were some micro pores of not greater than 100 nm. Further, it was observed that the reaction layer 3 was formed on the interface between the silicon nitride substrate 1 and the aluminum oxide layer 2. The surface of the aluminum oxide layer 2 had a superior smoothness.

Next, the copper plates 4, 5 each having a thickness of 0.3 mm were arranged so as to bring in contact with the aluminum oxide layer 2, then subjected to the heat treatment in a nitrogen gas (oxygen concentration of not greater than 100 ppm) at a temperature of 1443 K. By this heat treatment, the copper plates 4, 5 were bonded to the silicon nitride substrate 1, respectively. Thus obtained silicon nitride circuit substrate 6 was subjected to a characteristic evaluation, described later.

COMPARISON EXAMPLE 1

The silicon nitride circuit board was made similarly to the above Experimental Example 1, then subjected to the characteristic evaluation, described later, except that Si—O system oxide layers were formed on the surfaces of the silicon nitride circuit board by the thermal oxidization treatment (1473 K) in the Experimental Example 1.

REFERENCE EXAMPLE 1

A general sol including aluminum ethoxide was used as a material for forming the silicon nitride circuit board. The silicon nitride circuit board was made similarly to the above Experimental Example 1, then subjected to the characteristic evaluation, described later, except that the aluminum oxide layer was formed by one time of the process of coating/calcinating the sol. Incidentally, the thickness of the obtained aluminum oxide layer was not greater than 1 μm.

There was examined the bonding condition of the copper plates 4, 5 in the respective silicon nitride substrates which were obtained in the Experimental Example 1, the Comparison Example, and the Reference Example. As a result, there was observed no poor bonding and no blister on the silicon nitride circuit board of the Experimental Example 1. On the contrary, there were observed several blisters on the silicon nitride circuit board of the Comparison example 1. Also, the bonding strength and the thermal resistance of the copper plates of the respective silicon nitride circuit board were measured, which results are shown in Table 1.

TABLE 1

| | | Oxide Layer | | Bonding strength (N/cm) | Thermal resistance (Relative value) |
|---|---|---|---|---|---|
| | Material | Forming method | Thickness (μm) | | |
| Experimental Example 1 | $Al_2O_3$ | Alumina sol method | 2 | 50 | 1 |
| Comparison Example 1 | $SiO_2$ | Thermal oxidizing method | 2 | <10 | 2 |
| Reference Example 1 | $Al_2O_3$ | Sol-gel method | <1 | <10 | 1.2 |

As apparent form the above-mentioned measured results, in the silicon nitride circuit board according to the invention, the copper plate can be bonded to the silicon nitride substrate satisfactorily with a high bonding strength by the use of the DBC method, thereby obtaining a satisfactory thermal conductivity.

Moreover, in the silicon nitride circuit board according to the Reference Example 1, the aluminum oxide layer is formed by the use of the sol-gel method including one time of the coating/calcinating process. Therefore, the film thickness of the aluminum oxide layer is thinner than that of Experimental Example 1, the area substantially bonded to each other is small, thereby the above results are obtained. The satisfactory results, although these are inferior to those of Experimental Example 1, compared with Comparison Example 1 can be obtained by the use of the sol-gel method, by executing a plurality times of the coating/calcinating processes. However, these results are inferior in producing man-hour and producing cost to Experimental Example 1. Also, the alumina-sol method can obtain the satisfactory results in adhering strength and density of the aluminum oxide layer more than the sol-gel method.

EXPERIMENTAL EXAMPLES 2 TO 6

In the above-mentioned Experimental Example 1, the silicon nitride circuit substrates 6 ware, respectively, made similarly to that of Experimental Example 1, except that there were used a super fine grain alumina sol (water dispersing body/alumina sol-10 (trade name), made by Kawaken Fine Chemical Kabushiki Kaisha) to which are added Sn of 500 ppm (Experimental Example 2), Si of 1000 ppm (Experimental Example 3), Ti of 50 ppm (Experimental Example 4), Y of 200 ppm (Experimental Example 5), and Er of 500 ppm (Experimental Example 6). The bonding strength of these copper plates were measured and evaluated similarly to Experimental Example 1, which results are shown in Table 2.

TABLE 2

| | Oxide layer | | Bonding strength (N/cm) |
|---|---|---|---|
| | Addition element | Contents (ppm) | |
| Experimental Example 1 | — | — | 50 |
| Experimental Example 2 | Sn | 50 | 55 |

TABLE 2-continued

| | Oxide layer | | Bonding strength (N/cm) |
|---|---|---|---|
| | Addition element | Contents (ppm) | |
| Experimental Example 3 | Si | 1000 | 60 |
| Experimental Example 4 | Ti | 50 | 65 |
| Experimental Example 5 | Y | 200 | 55 |
| Experimental Example 6 | Er | 500 | 65 |

As apparent from Table 2, the bonding strength of the copper plates can be improved by containing in a range of 10 to 1000 ppm at least one element selected from a group of Sn, Si, Ti, Y and Er, in the aluminum oxide layer.

As described above, according to the silicon nitride circuit board of the invention, the oxide layer which is stable to the silicon nitride substrate can be formed reproducibly, which can depress the occurrence of the poor bonding and the blisters, etc., due to the micro defects of pores or cracks, etc., of the oxide layer, further can minimize the increase of the thermal resistance due to the oxide layer. Accordingly, there can be provided stably the DBC circuit board which is superior in heat transport ability by using the silicon nitride substrate. Also, according to the silicon nitride circuit board of the invention, there can be reproducibly made the silicon nitride circuit board which is high reliable and less in thermal resistance, as described above.

Many widely different embodiments of the invention may be constructed without departing from the spirit and scope of the invention. It should be understood that the invention is not limited to the specific embodiments described in the specification, except as defined in the appended claims.

What is claimed is:

1. A silicon nitride circuit plate comprising:
   a silicon nitride substrate;
   an oxide layer disposed on a surface of said silicon nitride substrate, said oxide layer consisting essentially of aluminum oxide and having pores of not more than 100 nm therein; and
   a copper system circuit plate directly bonded to said silicon nitride substrate through said oxide layer.

2. A silicon nitride circuit plate comprising:
   a silicon nitride substrate;
   an oxide layer disposed on a surface of said silicon nitride substrate,
   said oxide layer consisting essentially of a high purity of $\alpha$-$Al_2O_3$; and
   a copper system circuit plate directly bonded to said silicon nitride substrate through said oxide layer.

3. A silicon nitride circuit board as claimed in claim 2, wherein an reaction layer of said silicon nitride and said aluminum oxide is disposed on an interface between said silicon nitride substrate and said oxide layer.

4. A silicon nitride circuit board as claimed in claim 3, wherein said reaction layer includes Si, N, Al and O.

5. A silicon nitride circuit board as claimed in claim 4, wherein said reaction layer includes at least one element selected from a group of Sn, Si, Ti, Y and Er.

6. A silicon nitride circuit board as claimed in claim 2, wherein said oxide layer further includes in a range of 10 to 1000 ppm at least one element selected from a group of Sn, Si, Ti, Y and Er.

7. A silicon nitride circuit board as claimed in claim 3, wherein said oxide layer comprises a super fine grain alumina sol coated/calcined layer.

8. A silicon nitride circuit board as claimed in claim 2, wherein said silicon nitride substrate has a thermal conductivity of not less than 50 W/m K.

9. A method of producing a silicon nitride circuit board, comprising the steps of:
   coating a super fine grain alumina sol on a surface of a silicon nitride substrate, then forming an aluminum oxide layer by heat treatment in an air atmosphere;
   bringing a copper system circuit plate into contact with said silicon nitride substrate through said aluminum oxide layer; and
   bonding said the copper system circuit plate to said the silicon nitride substrate by heat treatment.

10. A method of producing a silicon nitride circuit board, as claimed in claim 9, wherein said super fine grain alumina sol comprises a colloid liquid in which super fine alumina grains having a grain size of about 2 to 20 nm are dispersed in a water in a range of 5 to 20% by weight.

11. A method of producing a silicon nitride circuit board, as claimed in claim 10, wherein said super fine grain alumina sol includes in a range of 10 to 1000 ppm at least one element selected from a group of Sn, Si, Ti, Y and Er.

12. A method of producing a silicon nitride circuit board, as claimed in claim 10, wherein said heat treatment, after said super fine grain alumina sol has been coated, is carried out in an atmosphere at a temperature of from 1173 to 1573 K.

* * * * *

UNITED STATES PATENT AND TRADEMARK OFFICE
CERTIFICATE OF CORRECTION

PATENT NO.: 5,912,066

DATED: June 15, 1999

INVENTOR(S): Takahashi

It is certified that an error appears in the above-identified patent and that said Letters Patent is hereby corrected as shown below:

Claim 8, column 12, line 65, "claim 3" should read --claim 2--.

Claim 11, column 14, line 6, "claim 10" should read --claim 9--.

Claim 12, column 14, line 10, "claim 10" should read --claim 9--.

Signed and Sealed this

Twenty-fifth Day of January, 2000

Attest:

Attesting Officer

Acting Commissioner of Patents and Trademarks